US007956618B2

(12) United States Patent
Lundquist et al.

(10) Patent No.: US 7,956,618 B2
(45) Date of Patent: Jun. 7, 2011

(54) ADDITIONAL PINS ON A USB CONNECTOR

(75) Inventors: Anders Lundquist, Malmo (SE); Markus Gustav Agevik, Malmo (SE); David Johansson, Malmo (SE); Anders Hansson, Klagerup (SE)

(73) Assignee: Sony Ericsson Mobile Communications AB, Lund (SE)

( * ) Notice: Subject to any disclaimer, the term of this patent is extended or adjusted under 35 U.S.C. 154(b) by 591 days.

(21) Appl. No.: 11/930,312

(22) Filed: Oct. 31, 2007

(65) Prior Publication Data

US 2009/0108848 A1 Apr. 30, 2009

(51) Int. Cl.
*G01R 31/04* (2006.01)

(52) U.S. Cl. ........................................................ 324/538

(58) Field of Classification Search .................. 324/538
See application file for complete search history.

(56) References Cited

U.S. PATENT DOCUMENTS 5,773,901 A 6/1998 Kantner
7,589,536 B2 * 9/2009 Terlizzi et al. ................ 324/538
2006/0050495 A1 3/2006 Warner, II et al.
2007/0032100 A1 2/2007 Yang et al.
2007/0099481 A1 5/2007 Alejandro et al.

FOREIGN PATENT DOCUMENTS

EP 1 562 267 8/2005

OTHER PUBLICATIONS

International Search Report and Written Opinion for International Application No. PCT/IB2008/001060 dated Sep. 4, 2008.

* cited by examiner

*Primary Examiner* — Amy He
(74) *Attorney, Agent, or Firm* — Renner, Otto, Boisselle & Sklar, LLP

(57) ABSTRACT

An electronic device includes a receptacle for communicating information via a first communication circuit and a second communication circuit different from the first communication circuit, the receptacle including a plurality of electrically conductive contacts having a predefined arrangement. The electronic device further includes a detection circuit and a configuration circuit. The detection circuit is operatively coupled to at least one of the plurality of contacts, and the detection circuit is operative to detect an electrical state of the at least one contact. The configuration circuit is operatively coupled to a first group of contacts of the plurality of contacts, and the configuration circuit is operative to communicatively couple the first group of contacts to the first communication circuit or the second communication circuit based on the detected state of the at least one contact.

20 Claims, 3 Drawing Sheets

ADDITIONAL PINS ON A USB CONNECTOR

TECHNICAL FIELD OF THE INVENTION

The present invention relates generally to electronic devices, such as electronic devices for engaging in voice communications, rendering media content, etc. More particularly, the invention relates to a system connector/port for use with electronic devices.

DESCRIPTION OF THE RELATED ART

Mobile and/or wireless electronic devices are becoming increasingly popular and are now in wide-spread use. In addition, the features associated with certain types of electronic devices have become increasingly diverse. To name a few examples, many electronic devices include cameras, text messaging capability, Internet browsing functionality, electronic mail capability, video playback capability, audio playback capability, image display capability, navigation capability, and hands-free headset interfaces.

To move data, such as movie clips, pictures, etc. to/from electronic devices, or to output audio and/or video data from the electronic device, a cable medium is often used that communicatively couples the electronic device to another device (e.g., a computer, another electronic device, a display device, an audio device, etc.). Such cable mediums typically include two connectors (one for each of the devices), a plurality of terminals in each connector, and conductive wire coupling the terminals in each connector. To transfer data to/from the electronic device via the cable, one of the connectors is coupled to a corresponding receptacle (which also includes corresponding terminals) in the electronic device, and the other connector is coupled to a corresponding receptacle of the other device (e.g., a computer, electronic device, etc.). The connection completes one or more electrical circuits, which enables data to be transferred between the devices.

A pervasive trend with electronic devices is the reduction in size and/or weight of such devices. For example, electronic devices employed in voice communications have reached dimensions that enable them to be comfortably placed in one's shirt or pants pocket, while at the same time packing the same or even more features than previous generation electronic devices.

SUMMARY

A drawback to reducing the dimensions of electronic devices is that the available space for receptacles, connectors and their corresponding cables also is reduced. To accommodate this reduction in size, new receptacles, connectors, etc. are developed to enable further reductions in size (e.g., USB has transitioned from the standard USB connector to the mini USB connector, and now to the micro USB connector). Each different interface, however, still requires a corresponding receptacle on the electronic device. Thus, if the device is to be used with multiple communication standards (e.g., a micro USB interface and a proprietary interface), then the device requires a separate receptacle for each interface.

The present invention provides a receptacle configuration that is compatible with two or more different communication interfaces, e.g., a first interface such as a USB interface (standard, mini or micro) and a second, different interface such as a high definition multimedia interface (HDMI), audio interface, proprietary interface, etc. For example, one or more contacts or pins of the first interface (e.g., a five pin micro USB interface) can be split into two or more pins within the receptacle. These additional pins can be used for the second interface and/or to identify the particular interface.

For example, as a corresponding micro USB connector (or other connector compatible with the first interface) is inserted into the receptacle, the split contacts can be coupled or bridged together by the contacts within the micro USB connector (e.g., the contacts of the connector electrically couple the split contacts of the receptacle). This bridging of the contacts can be used to identify that the connector is a micro USB connector (or other connector). Conversely, during use with the second communication interface (e.g., a non-micro USB cable is inserted into the receptacle), the split contacts may not be coupled together, and this lack of coupling can be used to identify the connector type inserted into the receptacle. Another way of identifying the cable connector (and thus configuring the receptacle) is by placing a predetermined signal level on the contacts (e.g., the connector may cause one or more contacts of the receptacle to be coupled to common, a predetermined voltage, or to predetermined impedance).

The state of the contacts can be detected by the electronic device and appropriate action may be taken. For example, if the micro USB connector is detected (e.g., the split contacts are coupled together by the contacts within the micro USB connector), then the contacts may be configured for use with USB. If a non-micro USB connector is detected (e.g., the split contacts are not coupled to one another), then the contacts may be configured for another communication interface.

In one embodiment of the invention, the first communication interface is a micro USB interface, and the second interface is an HDMI interface. This makes it possible to receive up to all twenty HDMI channels and still have full compatibility of the standard micro USB interface. Alternatively, a selected number of pins from the HDMI interface may be used instead of all twenty pins.

According to one aspect of the invention, an electronic device, includes: a receptacle for communicating information via a first communication circuit and a second communication circuit different from the first communication circuit, said receptacle including a plurality of electrically conductive contacts having a predefined arrangement; a detection circuit operatively coupled to at least one of said plurality of contacts, said detection circuit operative to detect an electrical state of the at least one contact; and a configuration circuit operatively coupled to a first group of contacts of the plurality of contacts, said configuration circuit operative to communicatively couple the first group of contacts to the first communication circuit or the second communication circuit based on the detected state of the at least one contact.

According to one aspect of the invention, the detection circuit comprises at least one monitoring device operatively coupled to the at least one contact, said monitoring device operative to detect the electrical state of the at least one contact.

According to one aspect of the invention, the at least one monitoring device is at least one of a voltage comparator circuit, a current comparator circuit, or an impedance measurement circuit.

According to one aspect of the invention, the configuration circuit comprises at least one switching device operatively coupled to the first communication circuit, the second communication circuit, and the first group of contacts.

According to one aspect of the invention, the at least one switching device is a transistor switch.

According to one aspect of the invention, the receptacle comprises a micro USB interface.

According to one aspect of the invention, the receptacle comprises a high definition multimedia interface, a data bus interface, a proprietary interface, a video interface, or an audio interface.

According to one aspect of the invention, the at least one contact comprises a first contact and a second contact, and the detection circuit monitors an electrical state of the first contact relative to the second contact.

According to one aspect of the invention, the configuration circuit operatively couples the first group of contacts to the first communication circuit when the first and second contacts are electrically connected to one another, and the configuration circuit operatively couples a second group of contacts to the second communication circuit when the at first and second contacts are not electrically connected to one another.

According to one aspect of the invention, the first group of contacts is different from the second group of contacts.

According to one aspect of the invention, the electronic device is a mobile telephone.

According to one aspect of the invention, the electronic device is a pager, electronic organizer, personal digital assistant, smart phone, portable gaming device, or a portable media device.

According to one aspect of the invention, the plurality of contacts are arranged in four rows having five columns.

According to one aspect of the invention, the receptacle comprises a receiver portion for receiving a corresponding cable connector, aid plurality of contacts arranged on the receiver portion.

According to one aspect of the invention, the receptacle is a female receptacle.

According to one aspect of the invention, the receptacle comprises at least one mechanical key for engaging a cable connector.

According to one aspect of the invention, a method of using a data receptacle for operation with a first communication interface and a second communication interface different from the first communication configuration, wherein the first communication interface includes a first set of contacts having a predefine arrangement includes: splitting at least one contact of the first set of contacts into a second set of contacts; monitoring an electrical characteristic of at least one contact of the second set of contacts; and configuring the first set of contacts and/or the second set of contacts for operation with the first communication interface or the second communication interface based on the monitored electrical characteristic.

According to one aspect of the invention, monitoring the electrical characteristic includes at least one of a) monitoring a voltage level of the at least one contact relative to a reference voltage, b) monitoring an impedance of the at least one contact relative to another contact, or c) monitoring an impedance of the at least one contact relative to a common buss of the electronic device.

According to one aspect of the invention, the first communication interface is at least one of a universal serial bus (USB) interface, a mini UB interface, or a micro USB interface.

According to one aspect of the invention, the second communication interface is at least one of a high definition multimedia interface (HDMI), an audio interface, a video interface, or a proprietary interface.

According to one aspect of the invention, an electronic device includes: a first data transfer circuit; a receptacle including a plurality of electrical contacts operatively coupled to the first data transfer circuit, said plurality of electrical contacts having a predefined arrangement that corresponds to the first data transfer circuit; and a second data transfer circuit different from the first data transfer circuit, wherein at least one contact of the plurality of contacts is split into a two or more contacts for operation with both the first and second data transfer circuits.

According to one aspect of the invention, the first data transfer circuit is a universal serial bus circuit, and said predefined arrangement of the electrical contacts is an arrangement corresponding to pinout of the universal serial bus standard.

To the accomplishment of the foregoing and the related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be suitably employed.

Other systems, methods, features, and advantages of the invention will be or become apparent to one with skill in the art upon examination of the following drawings and detailed description. It is intended that all such additional systems, methods, features, and advantages be included within this description, be within the scope of the present invention, and be protected by the accompanying claims.

Although the invention is shown and described with respect to one or more embodiments, it is to be understood that equivalents and modifications will occur to others skilled in the art upon the reading and understanding of the specification. The present invention includes all such equivalents and modifications, and is limited only by the scope of the claims.

Also, although the various features are described and are illustrated in respective drawings/embodiments, it will be appreciated that features of a given drawing or embodiment may be used in one or more other drawings or embodiments of the invention.

It should be emphasized that the term "comprise/comprising" when used in this specification is taken to specify the presence of stated features, integers, steps or components but does not preclude the presence or addition of one or more other features, integers, steps, components or groups thereof."

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Likewise, elements and features depicted in one drawing may be combined with elements and features depicted in additional drawings. Moreover, in the drawings, like reference numerals designate corresponding parts throughout the several views.

DETAILED DESCRIPTION OF EMBODIMENTS

Figure 1:
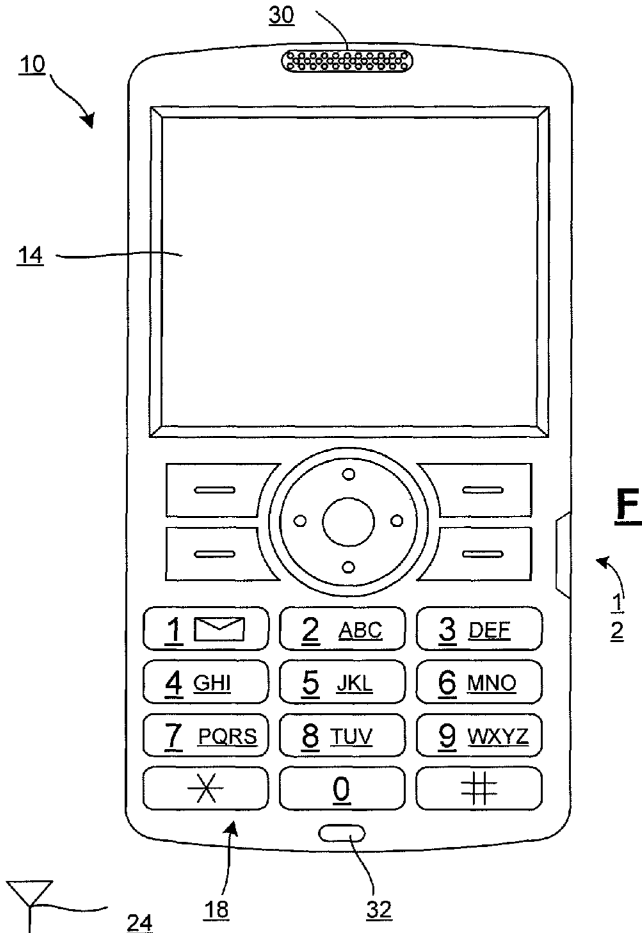
FIG. 1 is a schematic view of a mobile telephone as an exemplary electronic device in accordance with an embodiment of the present invention.

Embodiments of the present invention will now be described with reference to the drawings, wherein like reference numerals are used to refer to like elements throughout. It will be understood that the figures are not necessarily to scale.

The interchangeable terms "electronic equipment" and "electronic device" include portable radio communication equipment. The term "portable radio communication equipment," which hereinafter is referred to as a "mobile radio terminal," includes all equipment such as mobile telephones, pagers, communicators, electronic organizers, personal digital assistants (PDAs), smart phones, portable communication apparatus, portable gaming devices, portable media devices (video and/or audio), and the like.

In the present application, embodiments of the invention are described primarily in the context of a mobile telephone. However, it will be appreciated that the invention is not intended to be limited to the context of a mobile telephone and may relate to any type of appropriate electronic equipment.

Figure 2:
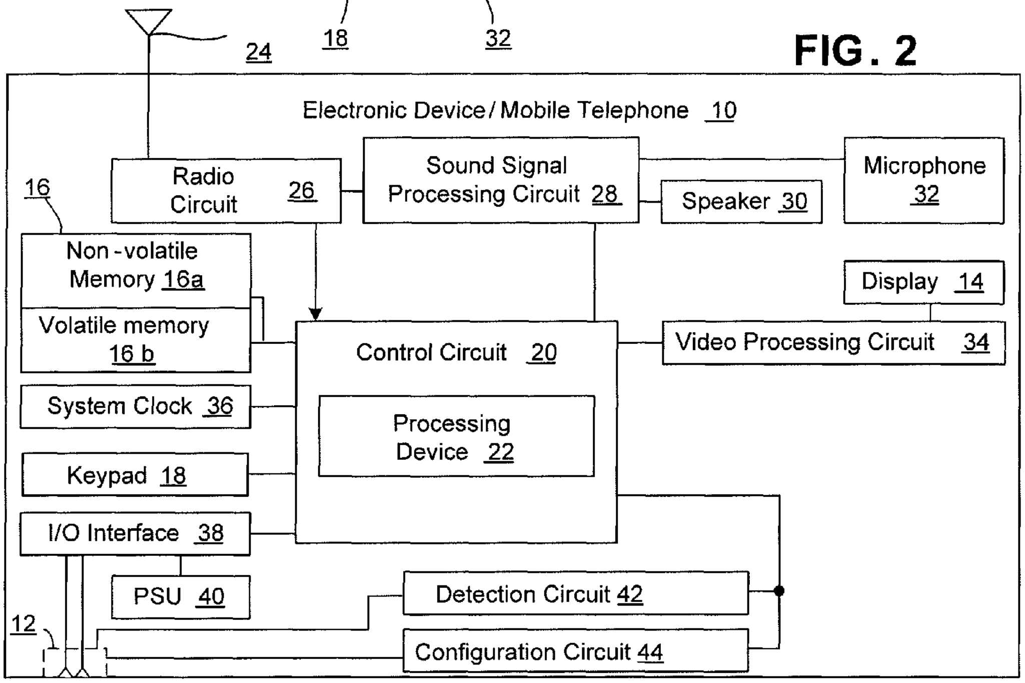
FIG. 2 is a schematic block diagram of the relevant portions of the mobile telephone of FIG. 1 in accordance with an embodiment of the present invention.

Referring initially to FIGS. 1 and 2, an electronic device 10 is shown. The electronic device 10 includes a combination port 12 configured to operate with a first interface, (e.g., a standard micro USB interface) and a second, different interface (e.g., HDMI). Additional details with respect to the combination port 12 will be described in greater detail below.

The electronic device of the illustrated embodiment is a mobile telephone and will be referred to as the mobile telephone 10. The mobile telephone 10 is shown as having a brick or block form factor, although other form factors, such as a "flip-open" form factor (e.g., a "clamshell" housing) or a slide-type form factor (e.g., a "slider" housing) also my be utilized.

The mobile telephone 10 may include a display 14. The display 14 displays information to a user such as operating state, time, telephone numbers, contact information, various navigational menus, etc., which enable the user to utilize the various features of the mobile telephone 10. The display 14 also may be used to visually display content received by the mobile telephone 10 and/or retrieved from a memory 16 (FIG. 2) of the mobile telephone 10.

A keypad 18 provides for a variety of user input operations. For example, the keypad 18 typically includes alphanumeric keys for allowing entry of alphanumeric information such as telephone numbers, phone lists, contact information, notes, etc. In addition, the keypad 18 typically includes special function keys such as a "call send" key for initiating or answering a call, and a "call end" key for ending or "hanging up" a call. Keys or key-like functionality also may be embodied as a touch screen associated with the display 14.

The mobile telephone 10 includes call circuitry that enables the mobile telephone 10 to establish a call and/or exchange signals with a called/calling device, typically another mobile telephone or landline telephone. However, the called/calling device need not be another telephone, but may be some other device such as an Internet web server, content providing server, etc. Calls may take any suitable form. For example, the call could be a conventional call that is established over a cellular circuit-switched network or a voice over Internet Protocol (VoIP) call that is established over a packet-switched capability of a cellular network or over an alternative packet-switched network, such as WiFi (e.g., a network based on the IEEE 802.11 standard), WiMax (e.g., a network based on the IEEE 802.16 standard), etc.

FIG. 2 represents a functional block diagram of the mobile telephone 10. For the sake of brevity, generally conventional features of the mobile telephone 10 will not be described in great detail herein.

The mobile telephone 10 includes a primary control circuit 20 that is configured to carry out overall control of the functions and operations of the mobile telephone 10. The control circuit 20 may include a processing device 22, such as a CPU, microcontroller or microprocessor. The processing device 22 executes code stored in a memory (not shown) within the control circuit 20 and/or in a separate memory, such as the memory 16, in order to carry out operation of the mobile telephone 10. The memory 16 may include a read only memory area that is implemented using nonvolatile memory 16*a*, and a random access or system memory area that is implemented using volatile memory 16*b*.

Continuing to refer to FIGS. 1 and 2, the mobile telephone 10 includes an antenna 24 coupled to a radio circuit 26. The radio circuit 26 includes a radio frequency transmitter and receiver for transmitting and receiving signals via the antenna 24 as is conventional. The radio circuit 26 may be configured to operate in a mobile communications system and may be used to send and receive data and/or audiovisual content. Receiver types for interaction with a mobile radio network and/or broadcasting network include, but are not limited to, GSM, CDMA, WCDMA, GPRS, WiFi, WiMax, DVB-H, ISDB-T, etc., as well as advanced versions of these standards.

The mobile telephone 10 further includes a sound signal processing circuit 28 for processing audio signals transmitted by and received from the radio circuit 26. Coupled to the sound processing circuit 28 are a speaker 30 and a microphone 32 that enable a user to listen and speak via the mobile telephone 10 as is conventional. The radio circuit 26 and sound processing circuit 28 are each coupled to the control circuit 20 so as to carry out overall operation. Audio data may be passed from the control circuit 20 to the sound signal processing circuit 28 for playback to the user. The sound processing circuit 28 may include any appropriate buffers, decoders, amplifiers and so forth.

The display 14 may be coupled to the control circuit 20 by a video processing circuit 34 that converts video data to a video signal used to drive the display 14. The video processing circuit 34 may include any appropriate buffers, decoders, video data processors and so forth. The video data may be generated by the control circuit 20, retrieved from a video file that is stored in the memory 16, derived from an incoming video data stream that is received by the radio circuit 28 or obtained by any other suitable method.

The mobile telephone 10 also may include a system clock 36 for clocking the various components of the mobile telephone 10, such as the control circuit 20. The control circuit 20 may, in turn, carry out timing functions, such as timing the durations of calls, generating the content of time and date stamps, and so forth.

The mobile telephone 10 may further include one or more I/O interface(s) 38. The I/O interface(s) 38 may be in the form of typical mobile telephone I/O interfaces and may include one or more electrical connectors. As is typical, the I/O interface(s) 38 may be used to couple the mobile telephone 10 to a battery charger to charge a battery of a power supply unit (PSU) 40 within the mobile telephone 10. In addition, or in the alternative, the I/O interface(s) 38 may serve to connect the mobile telephone 10 to a headset assembly (e.g., a personal handsfree (PHF) device) that has a wired interface with the mobile telephone 10. Further, the I/O interface(s) 38 may serve to connect the mobile telephone 10 to a personal computer or other device via a data cable for the exchange of data (e.g., via the combination receptacle 12). The mobile telephone 10 also may receive operating power via the I/O interface(s) 38 when connected to a vehicle power adapter or an electricity outlet power adapter.

Figure 3A:
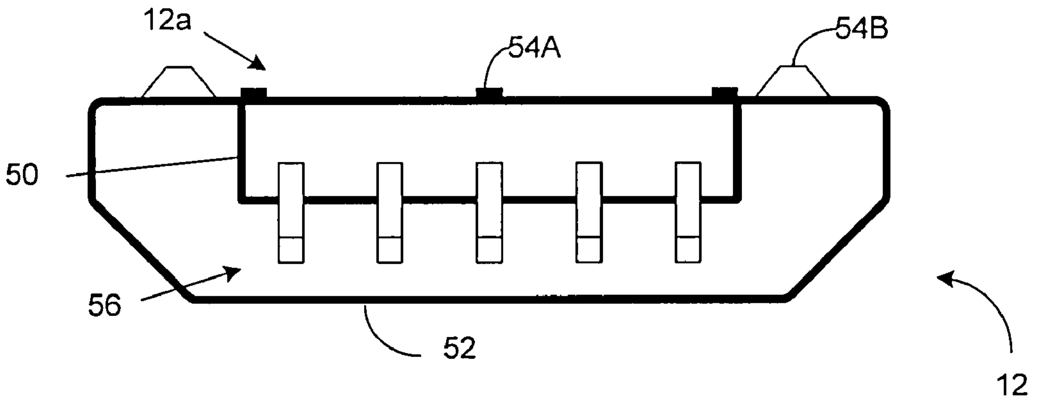
FIGS. 3A and 3B are schematic diagrams of an exemplary combination receptacle in accordance with the invention.
Figure 3B:
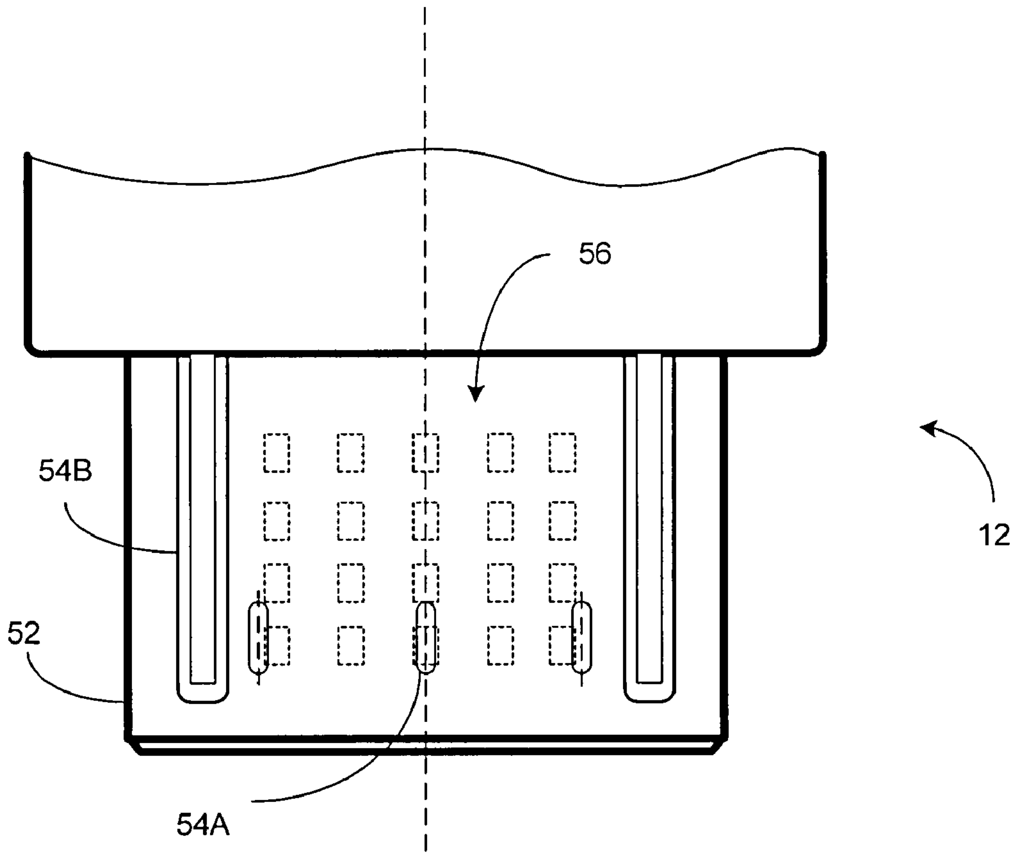

With further reference to FIGS. 3A and 3B, there is shown an exemplary combination receptacle 12 in accordance the invention. The combination receptacle 12 comprises a mechanical interface 12*a* for coupling with a corresponding cable connector (e.g., a connector portion of a cable). The mechanical interface 12*a* comprises a receiver portion 50 operative to accept a corresponding cable connector. The receiver portion 50, for example, may comprise a male receptacle or a female receptacle. Additionally, the mechanical interface 12*a* may include a housing 52 or the like for mounting the receptacle to a support structure, and/or for guiding and/or supporting the cable connector into the combination receptacle 12. The receiver portion 50 and housing 52 may be formed in any shape as needed for the particular application, non-limiting examples of which include a circular housing, a D-shell housing, a rectangular housing, etc. To ensure proper insertion of the cable connector into the receptacle 12, one or more mechanical keys 54A, 54B or the like can be provided on or around the housing 52 as is conventional.

Within the receiver portion 50 are a plurality of contacts or pins 56 for establishing electrical contact with a connector of a cable. Although the contacts 56 are shown in the receiver portion of the receptacle 12, the contacts 56 may be located in the housing 52, if desired. Additionally, the contacts 56 may be arranged in any one of a number of different configurations. In one embodiment, for example, the contacts 56 are arranged as four rows having five columns (i.e., each contact of a USB contact configuration is split into four contacts, which provides a 4×5 arrangement having twenty contacts). As will be appreciated, other arrangements are possible without departing from the scope of the invention (e.g., a 2×5 configuration, 3×5 configuration, 4×4 configuration, etc.). Additionally, not all contacts of the first interface need be split into multiple contacts, nor need all the contacts be equally split (e.g., in a five pin USB connector, the first four pins may be split into two pins, and the fifth pin may not be split or may be split into three or more pins). The particular contact configuration may depend on the specifics of the first and/or second interface that the combination receptacle is intended to be used with. The contacts 56 of the combination receptacle 12 are electrically coupled to the I/O interface 36 so as to provide electrical signals thereto for use within the mobile telephone 10.

Referring back to FIG. 2, the mobile telephone 10 also includes a detection circuit 42 that is operatively coupled to the control circuit 20 and/or configuration circuit 44. Additionally, the detection circuit 42 is operatively coupled to one or more contacts 56 of the combination receptacle 12, and can detect when at least one of the contacts 56 is placed in a specific electrical state (e.g., high, low, coupled (shorted) to another contact, a specific impedance between contacts, etc.). Based on the state of the one or more contacts 56, the detection circuit 42 can ascertain the type of cable connector that has been inserted into the combination receptacle 12.

The specific configuration of the contacts is dictated by the manner in which the cable connector configures the contacts 56 of the combination receptacle 12. For example, the cable connector may couple two or more contacts 56 together (e.g., short the contacts together), couple one or more contacts to a particular voltage level (e.g., couple a contact 56 to common or to power), or couple a predetermined impedance between two or more contacts. This coupling can be detected by the detection circuit 42 so as to determine the type of cable connector that has been inserted into the receptacle 12. The particular cable connector then can be communicated to the control circuit 20 and/or the configuration circuit 42.

Figure 4:
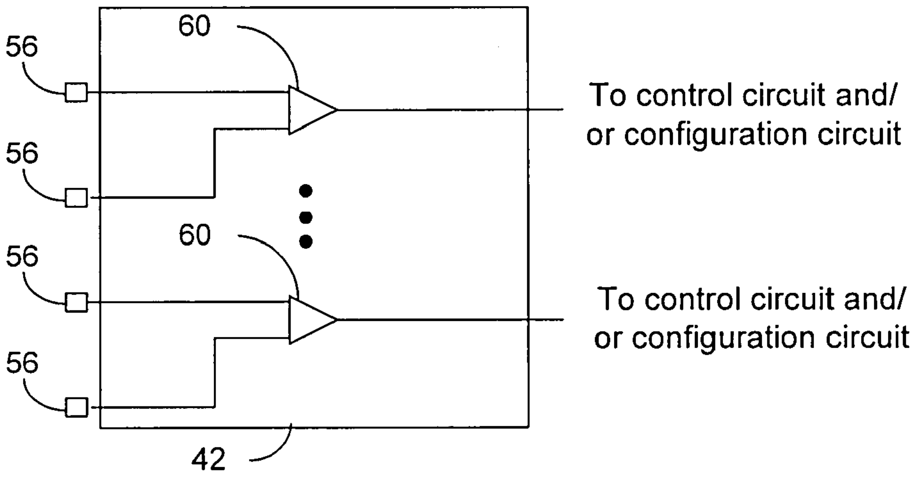
FIG. 4 is a schematic diagram of an exemplary detection circuit in accordance with the invention.

With further reference to FIG. 4, the detection circuit 42 includes one or more monitoring devices 60, such as voltage monitors, current monitors, impedance measuring devices, etc. The one or more monitoring devices 60 are operatively coupled to one or more contacts 56 so as to determine a characteristic of the one or more contacts 56. For example, it may be predetermined that if a first contact and a second contact of the combination receptacle 12 are coupled together (i.e., a short circuit between the respective contacts), then a first communication configuration (e.g., USB or other predefined configuration) should be selected, and if they are not coupled together, then a second communication configuration (e.g., HDMI or other predefined configuration) should be selected. This scenario can be implemented by using a monitoring device embodied as an impedance measuring device, wherein the respective first and second contacts are operatively coupled to the impedance measuring device. Then, if the impedance measuring device measures an open circuit between the respective contacts, it is known that an HDMI cable is inserted in the combination port 12, while if the impedance measuring device measures a closed circuit (e.g., a circuit having a very low impedance as is typical with two contacts coupled to one another), it is known that a USB cable is inserted in the combination port 12.

Another possibility is to monitor a voltage level on the one or more contacts 56. This can be implemented using one or more voltage comparators as the monitoring device 62. For example, one or more predetermined contacts 56 may be coupled to the voltage comparator along with a reference voltage (e.g., high or low voltage), wherein if the voltage level of the contact is high (or low), then it may be determined that a USB configuration (or HDMI configuration) is desired. This information then can be provided to the control circuit 20 and/or to the configuration circuit 44, which is described below.

Yet another way of identifying the specific cable connector is to include a resister having a predetermined resistance within the connector and/or within the receptacle 12. Then, as the cable connector is inserted into the receptacle 12, one leg of the resister, via the contacts 56 of the receptacle 12 and/or pins of the cable connector, can be coupled to common. The other leg can be operatively coupled to the impedance measurement circuit and the value of the resister can be measured. Within memory of the mobile telephone 10, different resistances can be stored and correlated with different cable connectors. Based on the measured resistance, the cable connector inserted into the receptacle can be determined.

For example, an open circuit measurement can be correlated with a USB connector, and a value of 10,000 ohms can be correlated with another connector (e.g., HDMI, proprietary etc.). Based on this measurement, the contacts 56 of the receptacle 12 can be configured for the appropriate interface.

Figure 5:
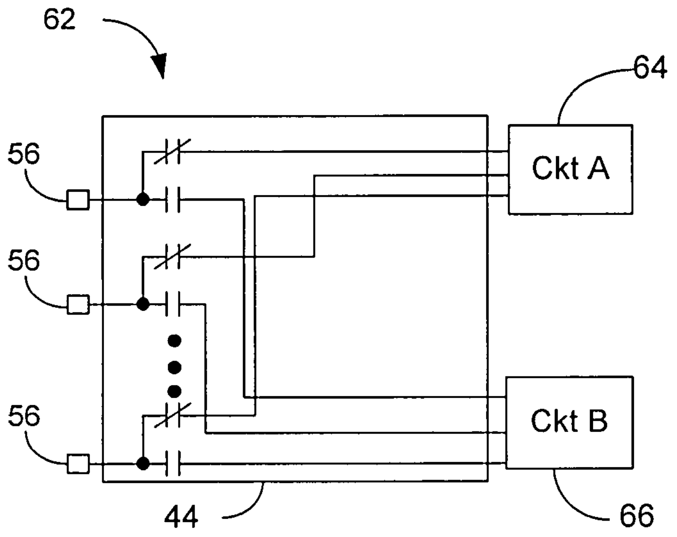
FIG. 5 is a schematic diagram of an exemplary configuration circuit in accordance with the invention.

With continued reference to FIG. 2 and further reference to FIG. 5, the configuration circuit 44 is operatively coupled to the control circuit 20 and/or to the detection circuit 42. The configuration circuit 44 also is operatively coupled to the combination receptacle 12 so as to switch the contacts 56 between different communication configurations based on data from the control circuit 20 and/or the detection circuit 42. The switching can be based on the detected cable inserted into the combination receptacle 12 (as detected by the detection circuit 42). For example, if a micro USB cable is inserted into the port, the configuration circuit 44 configures the contacts 56 for use with USB, otherwise the contacts are configured for use with another communication standard, such as HDMI.

The configuration circuit 44 includes a plurality of configuration devices 62, such as switches or the like. The switches 62, for example, may be embodied as transistor switches or mechanical switches. The switches may be controlled by coils, control signals, or the like as is conventional. One or more contacts 56 are operatively coupled to a respective switch so as to enable operation based on a first communication configuration (e.g., the first communication circuit 64), or based on a second communication configuration (e.g., the second communication circuit 66).

For example, the first communication circuit 64 may be a USB communication circuit, and the second communication circuit 66 may be an HDMI communication circuit. If the switches 62 couple the contacts 56 to the first communication circuit 64, then the contacts 56 will operate using the USB standard, while if the switches 62 couple the contacts 56 to second communication circuit 66, then the contacts 56 will operate using the HDMI standard.

For example, assuming the combination receptacle 12 is configured to communicate data over a micro USB interface (which comprises five contacts) and an HDMI interface (which comprises twenty contacts), then the contacts can be arranged in the aforementioned 4×5 pattern (e.g., each pin of the five pin USB connector is split into four pins, resulting in four rows each having five columns). Then, as a micro USB cable connector is coupled to the combination receptacle 12, the contacts within each column of the combination receptacle 12 will be shorted together by the micro USB connector (a micro USB cable can include five contacts that bridge across each column of the contacts 56). The detection circuit 42, which monitors the state of the one or more contacts 56, detects that the contacts in each column are shorted together (the impedance between contacts of a column is effectively zero ohms). This information then can be provided to the control circuit 20 and/or to the configuration circuit 44, which interprets the information as a micro USB cable being inserted into the receptacle 12. As a result, the contacts 56 are operatively coupled to the first communication circuit 64.

Figure 6A:
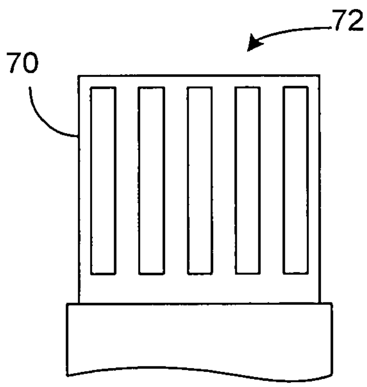
FIGS. 6A and 6B are schematic diagrams of exemplary connectors that may be used to interface with the combination receptacle of FIGS. 3A and 3B.
Figure 6B:
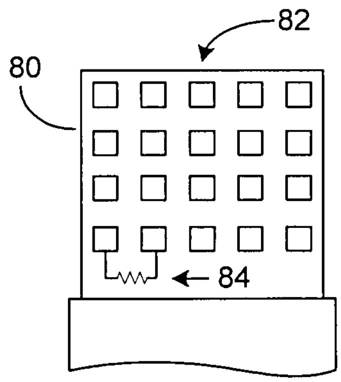

FIGS. 6A and 6B are schematic diagrams showing a contact layout of exemplary cable connectors that can be used to interface with the combination receptacle 12. The connector 70 of FIG. 6A is an exemplary micro USB connector configuration, wherein the connector includes five pins 72 each having a rectangular configuration. The contacts are arranged such that when the connector 70 is inserted into the combination receptacle 12, the pins 72 correspond to the five columns of contacts 56 within the receptacle 12. This has the effect of electrically connecting each contact 56 within a column to one another (each column, however, remains electrically isolated from the other columns). Thus, all the contacts 56 in each column are shorted together by respective pins 72 of the connector 70. The shorting of the contacts 56 within a column can be detected by the detection circuit 42 and interpreted as a micro USB connector being inserted into the combination receptacle 12 and, thus, the contacts 56 are configured for USB operation.

The connector 80 of FIG. 6B is an exemplary HDMI connector, and includes twenty pins 82 arranged in four rows of five columns. The pins 82 are arranged so as to correspond to the contacts 56 of the combination receptacle 12 when the connector 82 is inserted into the receptacle 12. When inserted into the receptacle 12, each pin 82 of the connector 80 is electrically coupled to a corresponding contact 56 of the receptacle 12. The contacts 56 (and corresponding pins 82), however, remain electrically isolated from one another (no two contacts 56 are electrically coupled together). The lack of electrical coupling between contacts 56 also can be detected by the detection circuit 42, and thus the contacts 56 are configured for HDMI operation.

The exemplary connector 80 optionally includes a resistor 84 coupled between two pins of the connector. As noted above, the value of this resister can be measured and, based on the measured value, the particular cable connector can be identified. Although shown in the cable connector 80, the resister may be placed within the combination receptacle 12.

Accordingly, a combination receptacle has been disclosed that enables efficient use of available space on ever shrinking electronic devices. The receptacle may be configured for any presently existing or subsequently developed interface, non-limiting examples of which include USB, mini USB, micro USB, firewire, HDMI, audio interfaces, or proprietary interfaces. For example, the first and second receptacles may comprise two standard interfaces (e.g., micro USB and HDMI), or a standard interface combined with a proprietary interface (e.g., a micro USB interface and a proprietary interface).

Additionally, it is noted that while the detection and configuration circuits have been described in the context of hardware circuits, at least a portion of the functionality implemented by the detection circuit 42 and the configuration circuit 44 may be implemented in software. The processing device 22, under the control of instructions provided in the software, then may implement at least part of the functionality of the detection circuit 42 and/or the configuration circuit 44.

Specific embodiments of the invention have been disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electronic device, comprising:

a receptacle for communicating information via a universal serial bus (USB) circuit and a data circuit different from the USB circuit, said receptacle including a plurality of electrically conductive contacts arranged in a row and column format with a plurality of rows and a plurality of columns, each column of the plurality of columns corresponding to one pin of the USB connector standard;

a detection circuit operatively coupled to at least one of said plurality of contacts, said detection circuit operative to detect an electrical state of the at least one contact; and a configuration circuit operatively coupled to a first group of contacts of the plurality of contacts, said configuration circuit operative to communicatively couple the first group of contacts to the USB circuit or the data circuit based on the detected state of the at least one contact.

2. The electronic device according to claim 1, wherein the detection circuit comprises at least one monitoring device operatively coupled to the at least one contact, said monitoring device operative to detect the electrical state of the at least one contact.

3. The electronic device according to claim 2, wherein the at least one monitoring device is at least one of a voltage comparator circuit, a current comparator circuit, or an impedance measurement circuit.

4. The electronic device according to claim 1, wherein the configuration circuit comprises at least one switching device operatively coupled to the USB circuit, the data circuit, and the first group of contacts.

5. The electronic device according to claim 4, wherein the at least one switching device is a transistor switch.

6. The electronic device according to claim 1, wherein the USB circuit comprises one of a standard USB interface, a mini USB interface, or a micro USB interface.

7. The electronic device according to claim 6, wherein the data circuit comprises a high definition multimedia interface, a data bus interface, a proprietary interface, a video interface, or an audio interface.

8. The electronic device according to claim 1, wherein the at least one contact comprises a first contact and a second contact, and the detection circuit monitors an electrical state of the first contact relative to the second contact.

9. The electronic device according to claim 8, wherein the configuration circuit operatively couples the first group of contacts to the USB circuit when the first and second contacts are electrically connected to one another, and the configuration circuit operatively couples a second group of contacts to the data circuit when the at first and second contacts are not electrically connected to one another.

10. The electronic device according to claim 9, wherein the first group of contacts is different from the second group of contacts.

11. The electronic device according to claim 1, wherein the electronic device is a mobile telephone.

12. The electronic device according to claim 1, wherein the electronic device is a pager, electronic organizer, personal digital assistant, smart phone, portable gaming device, or a portable media device.

13. The electronic device according to claim 1, wherein the plurality of contacts are arranged in four rows having five columns.

14. The electronic device according to claim 1, wherein said receptacle comprises a receiver portion for receiving a corresponding cable connector, said plurality of contacts arranged on the receiver portion.

15. The electronic device according to claim 1, wherein the receptacle is a female receptacle.

16. The electronic device according to claim 1, wherein the receptacle comprises at least one mechanical key for engaging a cable connector.

17. The electronic device according to claim 1, further comprising:

a first data transfer circuit operatively coupled to the plurality of contacts, wherein the predefined arrangement corresponds to the universal serial bus standard; and a second data transfer circuit based on a standard other than USB, wherein at least one contact of the plurality of contacts is split into a two or more contacts for operation with both the first and second data transfer circuits.

18. The electronic device according to claim 17, wherein said predefined arrangement of the electrical contacts is an arrangement corresponding to the pinout of the universal serial bus standard.

19. The electronic device according to claim 1, wherein at least one column of the plurality of columns includes at least two contacts.

20. The electronic device according to claim 19, wherein each column of the plurality of columns comprises at least two contacts.

* * * * *